United States Patent
Wu et al.

(10) Patent No.: US 7,381,575 B2
(45) Date of Patent: Jun. 3, 2008

(54) DEVICE AND METHOD FOR DETECTING ALIGNMENT OF ACTIVE AREAS AND MEMORY CELL STRUCTURES IN DRAM DEVICES

(75) Inventors: Tie Jiang Wu, Ilan (TW); Chien-Chang Huang, Hsinchu (TW); Bo Ching Jiang, Hualien (TW); Yu-Wei Ting, Taipei (TW); Chin-Ling Huang, Shulin (TW)

(73) Assignee: Nanya Technology Corporation, Taoyuan (TW)

( * ) Notice: Subject to any disclaimer, the term of this patent is extended or adjusted under 35 U.S.C. 154(b) by 470 days.

(21) Appl. No.: 11/096,836

(22) Filed: Mar. 30, 2005

(65) Prior Publication Data

US 2005/0184289 A1 Aug. 25, 2005

Related U.S. Application Data

(62) Division of application No. 10/673,310, filed on Sep. 29, 2003, now Pat. No. 7,026,647.

(30) Foreign Application Priority Data

Oct. 25, 2002 (TW) .............................. 91125197 A

(51) Int. Cl.
*H01L 21/66* (2006.01)

(52) U.S. Cl. ......... 438/14; 257/E21.522; 257/E21.531; 438/17

(58) Field of Classification Search ................ 438/14, 438/17; 257/E21.522, E21.53, E21.531
See application file for complete search history.

(56) References Cited

U.S. PATENT DOCUMENTS

| 5,576,223 | A | 11/1996 | Zeininger et al. |
| 5,977,558 | A | 11/1999 | Lee |
| 6,028,324 | A | 2/2000 | Su et al. |
| 6,221,681 | B1 * | 4/2001 | Sugasawara ................. 438/14 |
| 6,429,452 | B1 | 8/2002 | Jarvis |
| 6,716,653 | B2 * | 4/2004 | Look et al. .................... 438/14 |
| 2003/0034489 | A1 * | 2/2003 | Bhattacharya et al. ........ 257/48 |
| 2004/0153275 | A1 | 8/2004 | Wang |

* cited by examiner

*Primary Examiner*—Caridad M Everhart
(74) *Attorney, Agent, or Firm*—Quintero Law Office

(57) ABSTRACT

A test device and method for detecting alignment of active areas and memory cell structures in DRAM devices with vertical transistors. In the test device, parallel first and second memory cell structures disposed in the scribe line region, each has a deep trench capacitor and a transistor structure. An active area is disposed between the first and second memory cell structures. The active area overlaps the first and second memory cell structures by a predetermined width. First and second conductive pads are disposed on both ends of the first memory cell structures respectively, and third and fourth conductive pads are disposed on both ends of the first memory cell structures respectively.

3 Claims, 4 Drawing Sheets

__US 7,381,575 B2__

DEVICE AND METHOD FOR DETECTING ALIGNMENT OF ACTIVE AREAS AND MEMORY CELL STRUCTURES IN DRAM DEVICES

This application is a divisional of U.S. application Ser. No. 10/673,310, filed Sep. 29, 2003 now U.S. Pat. No. 7,026,647.

BACKGROUND OF THE INVENTION

1. Field of the Invention

The present invention relates to test devices, and more particularly, to a test device for detecting alignment of active areas and memory cell structures in DRAM devices with vertical transistors, as well as a test method thereof.

2. Description of the Related Art

With the wide application of integrated circuits (ICs), several kinds of semiconductor devices with higher efficiency and lower cost are presently produced based on different objectives, making DRAM an important semiconductor device in the information and electronics industry.

Most DRAM carries one transistor and one capacitor in a single DRAM cell. The memory capacity of the DRAM can reach 256 MB. Therefore, with increased integration it is necessary to reduce the size of memory cells and transistors to accommodate DRAM with higher memory capacity and processing speed. A 3-D capacitor structure can reduce the occupied area on the semiconductor substrate, such as with a deep trench capacitor, and is applicable to the fabrication of the DRAM with capacity of 64 MB and above.

As compared with a traditional plane transistor, however, this structure covers many areas of the semiconductor substrate and cannot satisfy the demands of high integration. Therefore, a vertical transistor which can save space is important in structuring a memory unit.

The adjacent memory cells may experience current leakage and cell failure, reducing process yield, if active area masks and memory cell structures are not aligned accurately. Therefore, process yield and reliability of the memory cells can be improved if alignment accuracy between the masks of active areas and memory cell structures is controlled within an acceptable range.

SUMMARY OF THE INVENTION

It is therefore an object of the present invention to detect alignment of active areas and memory cell structures in DRAM devices with vertical transistors.

According to the above mentioned object, the present invention provides a test device and method for detecting alignment of active areas and memory cell structures in DRAM devices with vertical transistors.

In the test device of the present invention, parallel first and second memory cell structures disposed in the scribe line region, each has a deep trench capacitor and a transistor structure. An active area is disposed between the first memory and second memory cell structures. The active area overlaps the first and second memory cell structures by a predetermined width. First and second conductive pads are disposed on both ends of the first memory cell structure respectively, and third and fourth conductive pads are disposed on both ends of the first memory cell structures respectively.

According to the present invention, a method for detecting alignment of active areas and memory cell structures in DRAM devices with vertical transistors includes the following steps. First, a wafer with at least one scribe line region and at least one memory region is provided. Then, a plurality of memory cells in the memory region and at least one test device in the scribe line region are formed simultaneously. A first resistance between the first and second conductive pads disposed on the first memory cell structure is measured. A second resistance between the third and fourth conductive pads disposed on the second memory cell structure is measured. Next, alignment of the active area and the first and second memory cell structures is determined according to the first resistance and the second resistance. Finally, alignment of the active area and the memory cells in the memory region is determined according to alignment of the active area and the first and second memory cell structures of the test device.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

In the present invention, at least one test device 200 is formed in the scribe line region, while a plurality of memory cells with vertical transistors is formed in the memory regions on a wafer simultaneously. The plurality of memory cells formed in the memory region is shown in FIG. 1 and FIG. 2 and the test device 200 is shown in FIG. 3.

Figure 1:
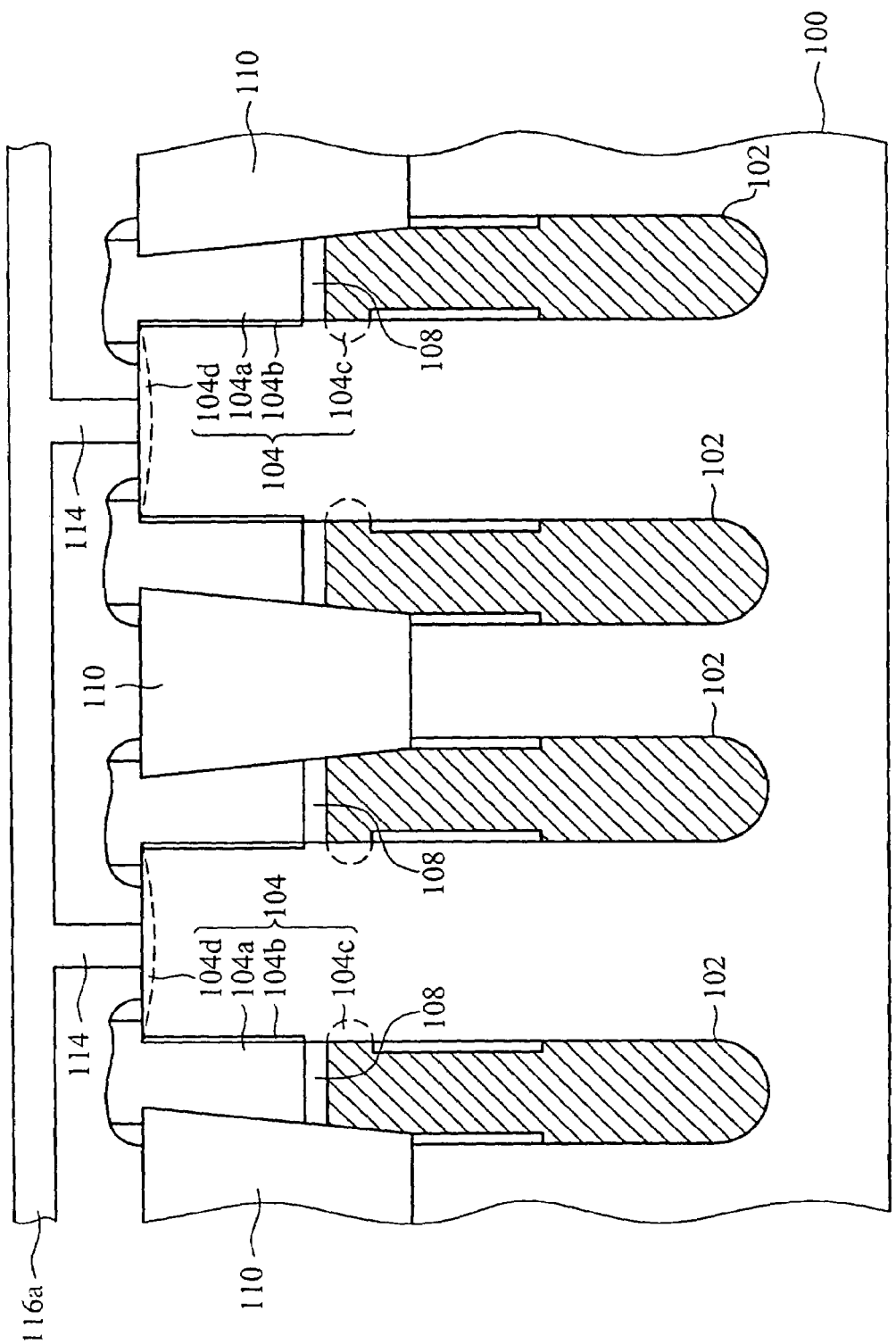
FIG. 1 is a cross section of a memory device with vertical transistors.

As shown in FIG. 1, deep trench capacitors 102 are formed into a matrix and disposed in the substrate 100. Each deep trench capacitor 102 has a vertical transistor 104 disposed thereon. Each vertical transistor 104 includes a gate 104a, a gate oxide layer 104b, a source 104c and a common drain 104d. The gate oxide layer 104b is the sidewall at the bottom of the gate 104a, and the vertical region between the source 104c and the common drain 104d in the substrate 100 is the channel of the transistor 104.

Figure 2:
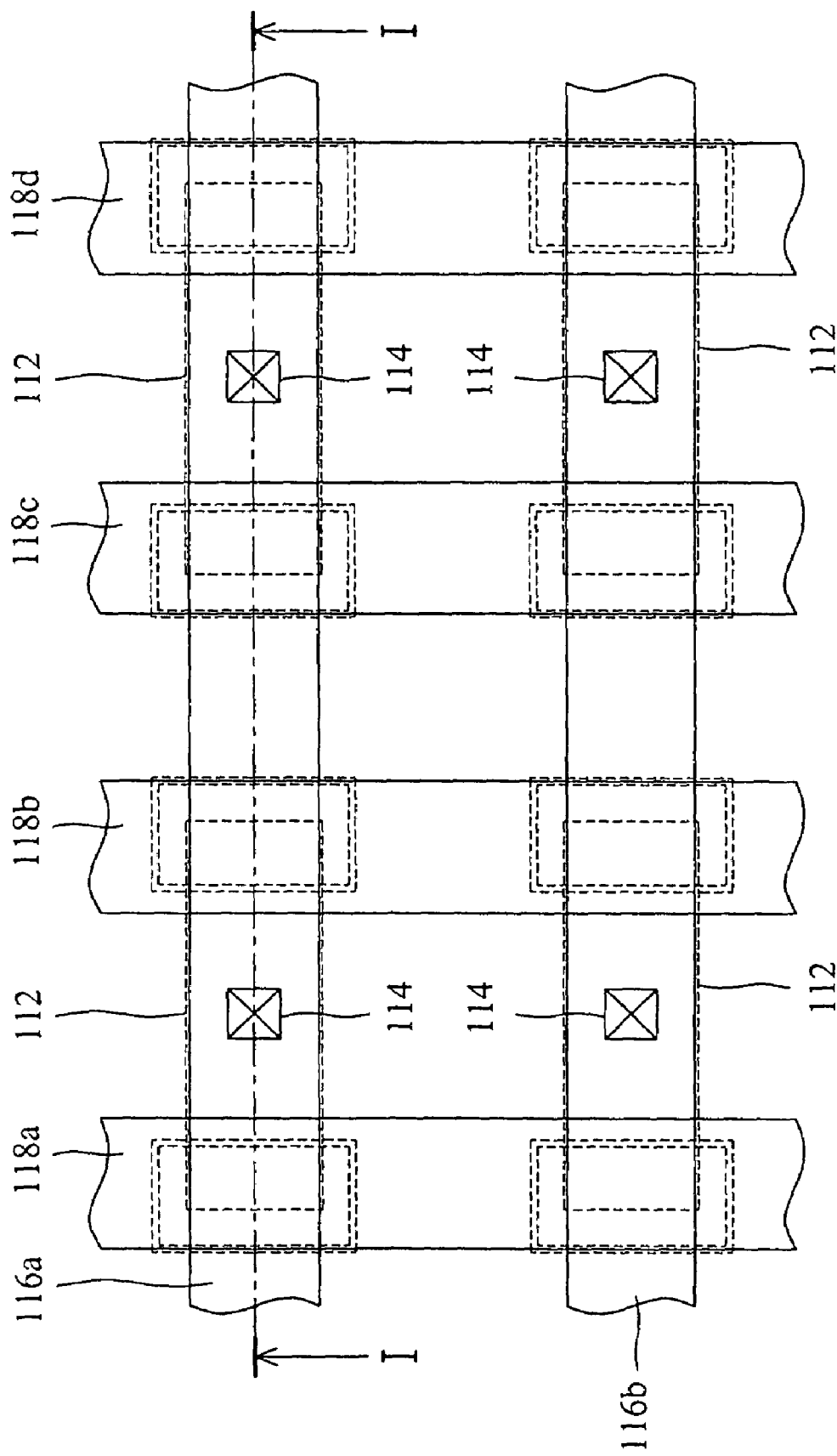
FIG. 2 is a layout of the memory device as shown in FIG. 1.

As shown in FIG. 2, word lines 118a, 118b, 118c and 118d are disposed above the active area 112 as the gate 104a of the transistor 104 (not shown). Command drains 104d are disposed above the active areas 112 between adjacent word lines 118a and 118b or 118c and 118d. Bit lines 116a and 116b are perpendicular to word lines 118a-118d, and are electrically coupled to the command drains through bit line contacts 114.

Figure 3:
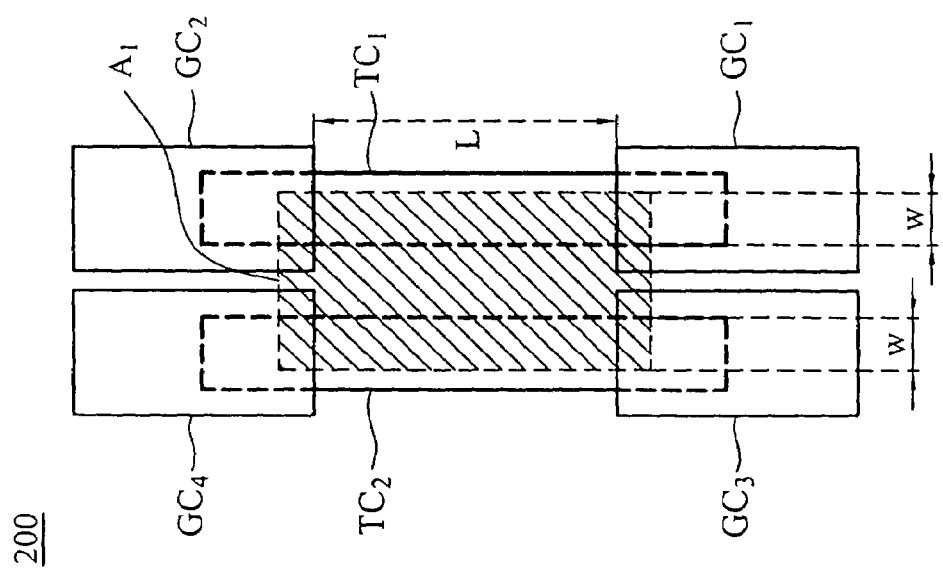
FIG. 3 is a layout of the test device according to the present invention.

FIG. 3 is a layout of the test device of the present invention. The test device 200 detects the alignment of active areas and memory cell structures in DRAM devices with vertical transistors, wherein the test device 200 is disposed in a scribe line region of a wafer (not shown).

In test device 200 shown in FIG. 3, parallel first and second memory cell structures $TC_1$ and $TC_2$ are disposed in the scribe line region (not shown), each has a deep trench capacitor and a transistor structure. An active area $A_1$ is disposed between the first memory cell structure $TC_1$ and the second memory cell structures $TC_2$. The active area $A_1$ overlaps the first and second memory cell structures ($TC_1$ and $TC_2$) a predetermined overlap width W. First and second conductive pads ($GC_1$ and $GC_2$) are disposed on both ends of the first memory cell structures $TC_1$ respectively, and third and fourth conductive pads ($GC_3$ and $GC_4$) are disposed on both ends of the first memory cell structures $TC_2$ respectively.

In the present invention, two parallel deep trenches in the scribe line region and a plurality of deep trenches in the memory region are formed simultaneously. Then, the parallel first and second memory cell structures $TC_1$ and $TC_2$ are formed in the two parallel deep trenches and the memory cells with vertical transistors are formed in the deep trenches in the memory region simultaneously. The parallel first and second memory cell structures $TC_1$ and $TC_2$, each has a deep trench capacitor and a transistor structure.

Next, active areas 112 in the memory region and an active area $A_1$ in the scribe line region are formed simultaneously with the same process and conditions. The active area $A_1$ is formed between the memory cell structures $TC_1$ and $TC_2$, and overlaps the memory cell structures $TC_1$ and $TC_2$ by a predetermined overlap width W respectively.

The word lines 118a~118b of the memory cells in the memory regions and the first to fourth conductive pads $GC_1$~$GC_4$ on the memory cell structures $TC_1$ and $TC_2$ are formed simultaneously with the same masks, process and conditions. The first and second conductive pads $GC_1$ and $GC_2$ are disposed on both ends of the first memory cell structure $TC_1$ respectively. The third and fourth conductive pads $GC_3$ and $GC_4$ are disposed on both ends of the second memory cell structure $TC_2$ respectively. The first to fourth conductive pads and the bar-type conductive pad are made of the same material, such as polysilicon. The first and second conductive pads $GC_1$ and $GC_2$ are electrically coupled to the transistor structure (gate) under the deep trench capacitor of the first memory cell structure $TC_1$ respectively. The third and fourth conductive pads $GC_3$ and $GC_4$ are electrically coupled to the transistor structure (gate) under the deep trench capacitor of the second memory cell structures $TC_2$ respectively. In addition, the first conductive pad $GC_1$ are a predetermined distance L from the second conductive pad $GC_2$, and the third conductive pad $GC_1$ are the predetermined distance L from the fourth conductive pad $GC_4$.

Figure 4:
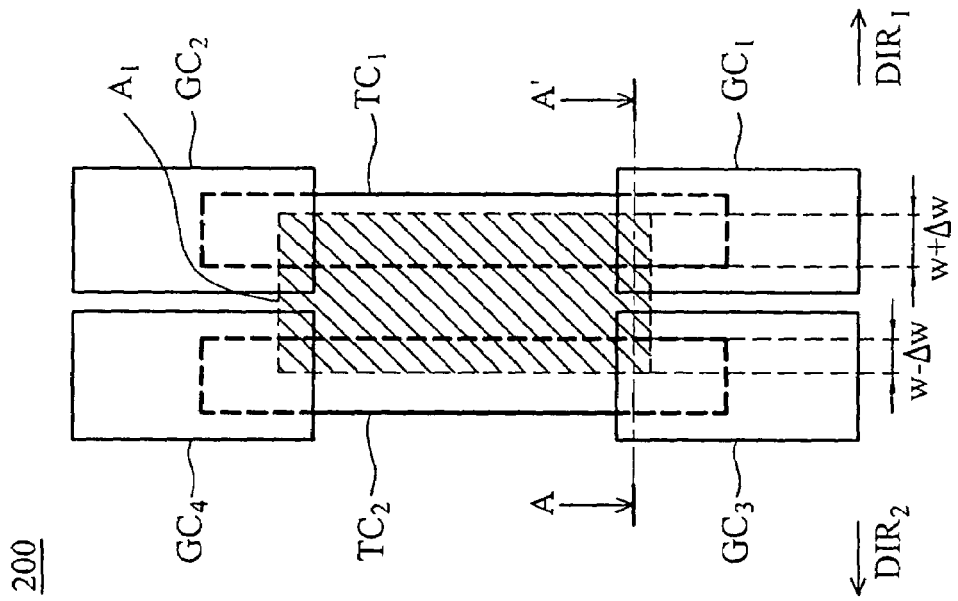
FIG. 4 is another layout of the test device with alignment shift according to the present invention.
Figure 5:
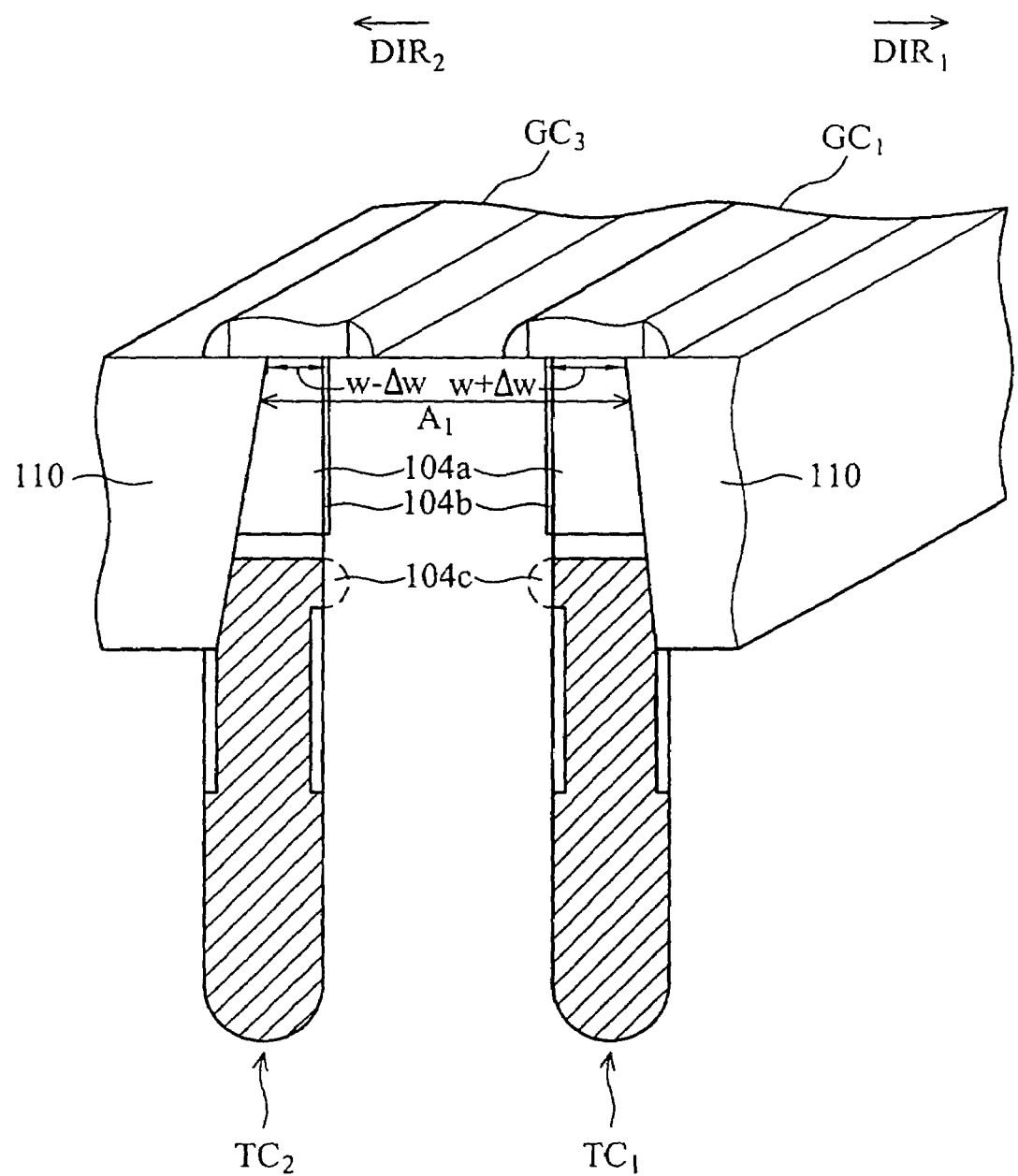
FIG. 5 is a cross section of the test device according to the present invention.

With reference to FIG. 4 and FIG. 5, normally, a first resistance $R_1$ between the first conductive pad $GC_1$ and the second conductive pad $GC_2$ on both ends of the first memory cell structure $TC_1$ can be detected. A second resistance $R_2$ between the third conductive pad $GC_3$ and the fourth conductive pad $GC_4$ on both ends of the second memory cell structure $TC_2$ can be detected. The first resistance $R_1$ and the second resistance $R_2$ can be obtained according to equations 1 and 2.

$$R_1 = R_{CT} \times \frac{L}{W + \Delta W}; \quad (1)$$

$$R_2 = R_{CT} \times \frac{L}{W - \Delta W}; \quad (2)$$

Wherein $R_{CT}$ is the resistance per surface area of memory cell structures ($TC_1$ and $TC_2$), L is the predetermined distance between the first and second conductive pads ($GC_1$ and $GC_2$) and between the third and fourth conductive pads ($GC_3$ and $GC_4$) respectively, W+$\Delta$W is the overlap width between the active area $A_1$ and the first memory cell structure $TC_1$, and W−$\Delta$W is the overlap width between the active area $A_1$ and the second memory cell structure $TC_2$. Using the same process, material and conditions, equations 3 and 4 can be achieved according to the equations 1 and 2.

$$\frac{R_1}{R_2} = \frac{W - \Delta W}{W + \Delta W}; \quad (3)$$

$$\Delta W = W \times \frac{R_2 - R_1}{R_2 + R_1}; \quad (4)$$

Thus, the alignment shift $\Delta W$ between the active area $A_1$ and the first and second memory cell structure $TC_1$ and $TC_2$ can be obtained if the first resistance $R_1$ and the second resistance $R_2$ are measured. That is to say, the alignment shift $\Delta W$ of the active area $A_1$ and the first and second memory cell structures ($TC_1$ and $TC_2$) is zero when the first resistance $R_1$ equals the second resistance $R_2$.

With reference to FIG. 4 and FIG. 5, the active area $A_1$ is shifted by a distance $\Delta W$ along the direction $DIR_1$ if the masks of the first and second memory cell structure ($TC_1$ and $TC_2$) and the active area $A_1$ have an alignment shift $\Delta W$ in the direction $DIR_1$. If this condition is met, the first resistance $R_1$ is smaller than the second resistance $R_2$ according to the equations 1 and 2. Moreover, the alignment shift $\Delta W$ can be obtained according to the equation 4.

On the contrary, the active area $A_1$ is shifted by a distance $\Delta W$ along the direction $DIR_2$ if the masks of the first and second memory cell structures ($TC_1$ and $TC_2$) and the active area $A_1$ have an alignment shift $\Delta W$ in the direction $DIR_2$. If this condition is met, the first resistance $R_1$ is larger than the second resistance $R_2$ according to the equations 1 and 2. Moreover, the alignment shift can be obtained according to the equation 4.

In the present invention, the test device 200 disposed in the scribe line region and a plurality of memory cells with vertical transistors in the memory region are formed simultaneously. For example, the deep trench capacitor and transistor structure of the memory cells in the memory region and the deep trench capacitor and transistor structure of the memory cell structures ($TC_1$ and $TC_2$) in the scribe line region are formed simultaneously with the same masks, process and conditions. The active areas 112 of the memory cells in the memory region and the active area $A_1$ of the test device 200 are formed simultaneously with the same masks, process and conditions. Therefore, the memory region and the test device may have the same alignment shift between memory cell structures ($TC_1$ and $TC_2$) and active areas (112 and $A_1$) use of the same masks and the same process. Thus, alignment of memory cell structures and active areas in the memory region can be obtained according to whether the first resistance $R_1$ equals the second resistance $R_2$.

The present invention also provides a method for detecting alignment of memory cell structures and active areas in memory devices with vertical transistors. In the method of the present invention, a wafer with at least one scribe line region and at least one memory region is provided.

A plurality of memory cells with vertical transistors in the memory region and at least one test device in the scribe line region are formed simultaneously, wherein each memory cell has a deep trench capacitor and a corresponding transistor structure (memory cell structure) as shown in FIG. 1 and FIG. 2. The structure of the test device 200 is shown in FIG. 3. The memory cell structure in the memory regions and the memory cell structure (TC$_1$ and TC$_2$) in the test device 200 are formed by the same mask and the same process. The active areas 112 in the memory regions and the active area A$_1$ in the test device 200 are formed with the same mask and process.

Next, a first resistance R$_1$ between the first conductive pad GC$_1$ and the second conductive pad GC$_2$ on both ends of the first memory cell structure TC$_1$ is determined. A second resistance R$_2$ between the third conductive pad GC$_3$ and the fourth conductive pad GC$_4$ on both ends of the second memory cell structure TC$_2$ is determined. Then, alignment of the active area A$_1$ and the first and second memory cell structures TC$_1$ and TC$_2$ of the test device 200 is determined according to whether the first resistance R$_1$ is equal to the second resistance R$_2$.

The memory region and the test device may have the same alignment shift between active areas (A$_1$ and 112) and memory cell structures (TC$_1$ and TC$_2$) use the same masks and the same process. Thus, alignment of active areas and memory cell structures in the memory region can be obtained according to whether the first resistance R$_1$ equals the second resistance R$_2$. The alignment shift between active areas and memory cell structures in the memory regions can also be obtained according to the equation 4.

Further, in the present invention the test device is disposed in the scribe line region to avoid occupying layout space.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for detecting alignment of deep trench capacitors and word lines in DRAM devices with vertical transistors, comprising:

providing a wafer with at least one scribe line region and at least one memory region;

forming a plurality of memory cells with vertical transistors in the memory region and at least one test device in the scribe line simultaneously with the same masks and process, the test device including:

parallel first and second memory cell structures disposed in the scribe line region, each having a deep trench capacitor and a vertical transistor structure;

an active area disposed between the first and second memory cell structures, wherein the active area overlaps the first and second memory cell structures a predetermined width; and first to fourth conductive pads disposed on both ends of the first and second memory cell structures respectively;

detecting a first resistance between the first and second conductive pads disposed on both ends of the first memory cell structure, and a second resistance between the third and fourth conductive pads disposed on both ends of the second memory cell structure;

determining alignment of the active area and the first and the second memory cell structures when the active area is shifted according to the first resistance and the second resistance; and determining alignment of the active area and the memory cells in the memory regions when the active area is shifted according to alignment of the active area and the first and the second memory cell structures of the test device.

2. The method as claimed in claim 1, further comprising a step of determining alignment shift (Δw) of the active area and the first and the second memory cell structures according to the first resistance, the second resistance, and the predetermined width between first and second memory cell structures and the active area respectively.

3. The method as claimed in claim 2, wherein the alignment shift (ΔW) is estimated by an equation:

$$\Delta W = W \times \frac{(R_2 - R_1)}{(R_2 + R_1)};$$

wherein W is the predetermined overlap width between first and second memory cell structures and the active area respectively; R1 is the first resistance between the first and second conductive pads disposed on both ends of the first memory cell structure; and R2 is the second resistance between the third and fourth conductive pads disposed on the second memory cell structure.

* * * * *